US006935352B2

United States Patent
Mount

(10) Patent No.: US 6,935,352 B2
(45) Date of Patent: Aug. 30, 2005

(54) ADDING ENERGY TO A CLEANING PROCESS FLUID FOR REMOVING PHOTO RESIST, RESIDUES AND PARTICLES FROM SEMICONDUCTOR SUBSTRATES, PHOTO MASKS, RETICLES, DISKS AND FLAT-PANEL DISPLAYS

(75) Inventor: David J. Mount, North Andover, MA (US)

(73) Assignee: S.C. Fluids, Inc., Nashua, NH (US)

( * ) Notice: Subject to any disclaimer, the term of this patent is extended or adjusted under 35 U.S.C. 154(b) by 0 days.

(21) Appl. No.: 10/755,432

(22) Filed: Jan. 12, 2004

(65) Prior Publication Data

US 2004/0139986 A1 Jul. 22, 2004

Related U.S. Application Data

(60) Provisional application No. 60/439,137, filed on Jan. 10, 2003.

(51) Int. Cl.[7] ................................. B08B 3/10
(52) U.S. Cl. ................. 134/184; 134/187; 134/188; 366/273
(58) Field of Search ................. 134/1.3, 10, 184, 134/187, 188, 189; 366/273

(56) References Cited

U.S. PATENT DOCUMENTS

| 5,337,446 | A | * | 8/1994 | Smith et al. ................. 15/21.1 |
|---|---|---|---|---|
| 5,417,768 | A | * | 5/1995 | Smith et al. ................. 134/10 |
| 5,509,431 | A | * | 4/1996 | Smith et al. ................. 134/95.1 |
| 5,526,834 | A | * | 6/1996 | Mielnik et al. ............. 134/105 |
| 5,698,163 | A | | 12/1997 | Mandel |
| 6,067,728 | A | | 5/2000 | Farmer et al. |
| 6,277,753 | B1 | | 8/2001 | Mullee et al. |
| 6,602,349 | B2 | | 8/2003 | Chandra et al. |
| 6,736,906 | B2 | * | 5/2004 | Cotte et al. ................. 134/33 |
| 2002/0086537 | A1 | | 7/2002 | Mullee et al. |
| 2003/0116176 | A1 | | 6/2003 | Rothman et al. |
| 2004/0003831 | A1 | | 1/2004 | Mount |

FOREIGN PATENT DOCUMENTS

WO        WO 03/061860 A1        7/2003

* cited by examiner

Primary Examiner—Michael Barr
Assistant Examiner—Saeed Chaudhry
(74) Attorney, Agent, or Firm—Maine & Asmus

(57) ABSTRACT

A supercritical fluid cleaning system and method comprising mainly a pressure chamber, a closable lid, a substrate support for holding at least one substrate, a rotable shaft extending outward from within the chamber, an external rotary power source coupled magnetically or otherwise to the shaft, and a rotable component or impeller attached to the chamber end of the shaft in close proximity to the substrate holding position, and baffles located close to the rotable component. The rotable component is conigured for rotation within the supercritical phase fluid in the chamber close to the surface of the wafer for causing agitation and turbulent fluid flow against the surface of the substrate, and increased intra-chamber fluid circulation.

8 Claims, 2 Drawing Sheets

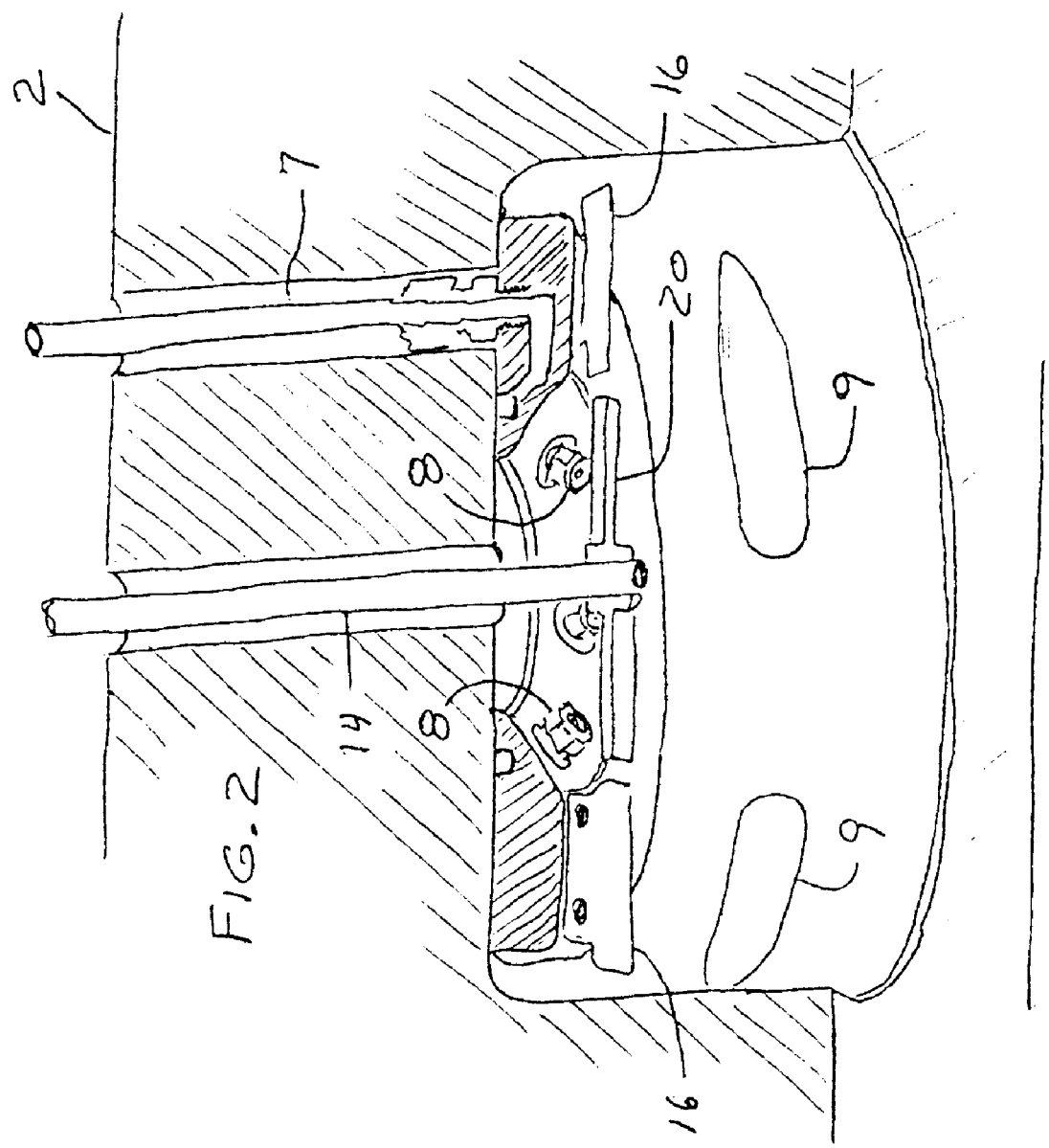

ADDING ENERGY TO A CLEANING PROCESS FLUID FOR REMOVING PHOTO RESIST, RESIDUES AND PARTICLES FROM SEMICONDUCTOR SUBSTRATES, PHOTO MASKS, RETICLES, DISKS AND FLAT-PANEL DISPLAYS

This application claims priority to pending U.S. application Ser. No. 60/439,137, filed Jan. 10, 2003.

FIELD OF INVENTION

This invention relates to supercritical phase cleaning of semiconductor and other substrates and articles with the addition of mechanical energy to the cleaning environment, and in particular with the addition of an independent source of mechanical energy to impart turbulence and increase intra-chamber circulation of the supercritical phase fluid within the cleaning environment.

BACKGROUND OF INVENTION

The prior art of supercritical fluid cleaning methods and systems for removing photo resist from semiconductor substrates and related requirements involves injecting fluid and additives into a cleaning chamber, and elevating the temperature and pressure to supercritical levels where a combination of chemical and mechanical mechanisms perform the necessary work to loosen and remove the unwanted materials. The cleaning fluid mixture may be elevated in temperature and pressure to supercritical state prior to injection into the chamber or the chamber may have internal heating elements to heat the fluid from liquid under pressure to supercritical state. Directional control of the through-flow of fluid through the chamber, as by nozzles or other flow directing devices, has provided the principle mechanical mechanism or component of the method of cleaning, directing the flow at or towards the surface at a desired angle. Spinning of the substrate beneath a nozzle to effectively accelerate the wafer against the fluid flow has also been disclosed. Transducers have been used to attempt to induce a wave pattern in the fluid at various frequencies. There remains a need for inserting more mechanical energy into the cleaning process to supplement the chemical processes that are occurring.

SUMMARY OF INVENTION

Experimental data confirms that in order to completely remove organic photo resists, residues and anti-reflective coatings or films from semiconductor substrates and other surfaces, with a supercritical fluid process; both chemical interaction between the fluid and film, as well as some kind of mechanical force or energy is required.

Chemical interaction is provided by exposing the film to a supercritical fluid (SCF) in a process chamber or pressure vessel, typically with a pre-selected co-solvent additive in solution with the SCF that will diffuse into, swell, soften and de-bond the organic films from the surface of the substrate. To completely remove this swelled and softened material from the substrate surface, some mechanical force must be applied to the film. However, the isolation of the pressure chamber and the scope of the surface architecture and delicacy of the small features of the materials being cleaned makes the introduction and application of any mechanical device or structure to assist in film removal, virtually impossible. The only available medium by which mechanical force can be applied to the substrate is the super critical fluid itself. This means that an additional mechanical force affecting the fluid/substrate interface must be use in conjunction with the chemical interactions.

Some limited mechanical energy is obviously available in the form of a through flow of SCF through the chamber, which may be directed by various means against or along the surface of the substrate. However, it may not be efficient to maintain a through flow throughout the cleaning period or cycle, and furthermore, it would require extremely large amount of volume and/or pressure in excess of the chemical and supercritical fluid requirements to provide an optimal amount of mechanical energy in this manner.

Therefore the introduction into the chamber of an independent source of mechanical energy or force that will result in agitation, intra-chamber fluid flow and turbulence is a principle goal of the invention.

However, best practice in working at very high pressure dictates that integrity of the pressure chamber by compromised by as few openings as possible. Therefore it is a further goal of the invention that additional energy be inserted by configuring a mechanical assembly that is reactive to the application of a variable force field which can be applied from outside the chamber, penetrating the chamber walls without mechanical compromise. Such a variable force field may be in the form of a rotating magnetic or electromagnetic force field such as is provided by an externally mounted motor that is magnetically coupled to a drive shaft within the chamber; the drive shaft being part of the mechanical assembly that induces the desired agitation, turbulence and intra-chamber fluid flow.

Other variations on the type and geometry of an externally applied varying force field, and other modes of transferring mechanical energy into the chamber, including plunger, lever, or rotating shaft for direct mechanical linkage, are also within the scope of the invention. Alternatively the drive shaft or other mechanical linkage may be hydraulically actuated or fluidly coupled to an exterior power supply. The invention may be configured to accommodate any preferred orientation of a substrate during cleaning, including right side up, on edge, or upside down.

It should be noted for purposes of the invention that the degree of agitation, turbulence and intra-chamber fluid flow introduced by the method and apparatus disclosed is distinguished from the wave pattern generation of wave pattern transducers. Transducers such as ultrasonic transducers used in some cleaning processes may form cavitation bubbles that provide a form of scrubbing action on the surface of an article as they form and collapse, but these types of transducers do not generate a turbulent fluid flow with significant kinetic energy in the manner of this invention.

The invention extends to and includes supercritical fluid cleaning processes for removing materials including photo resist, coatings, films, residues, and particles from wafers, substrates and surfaces of all types including semiconductor substrates, photo masks, reticules, disks, and flat-panel displays.

BRIEF DESCRIPTION OF THE FIGURES

FIG. 2 is a close up perspective cross section view of the embodiment of FIG. 1, illustrating the shaft, impellor, and fixed baffle plates within the cleaning chamber, the substrate removed for clarity.

DESCRIPTION OF THE PREFERRED EMBODIMENT

Figure 1:
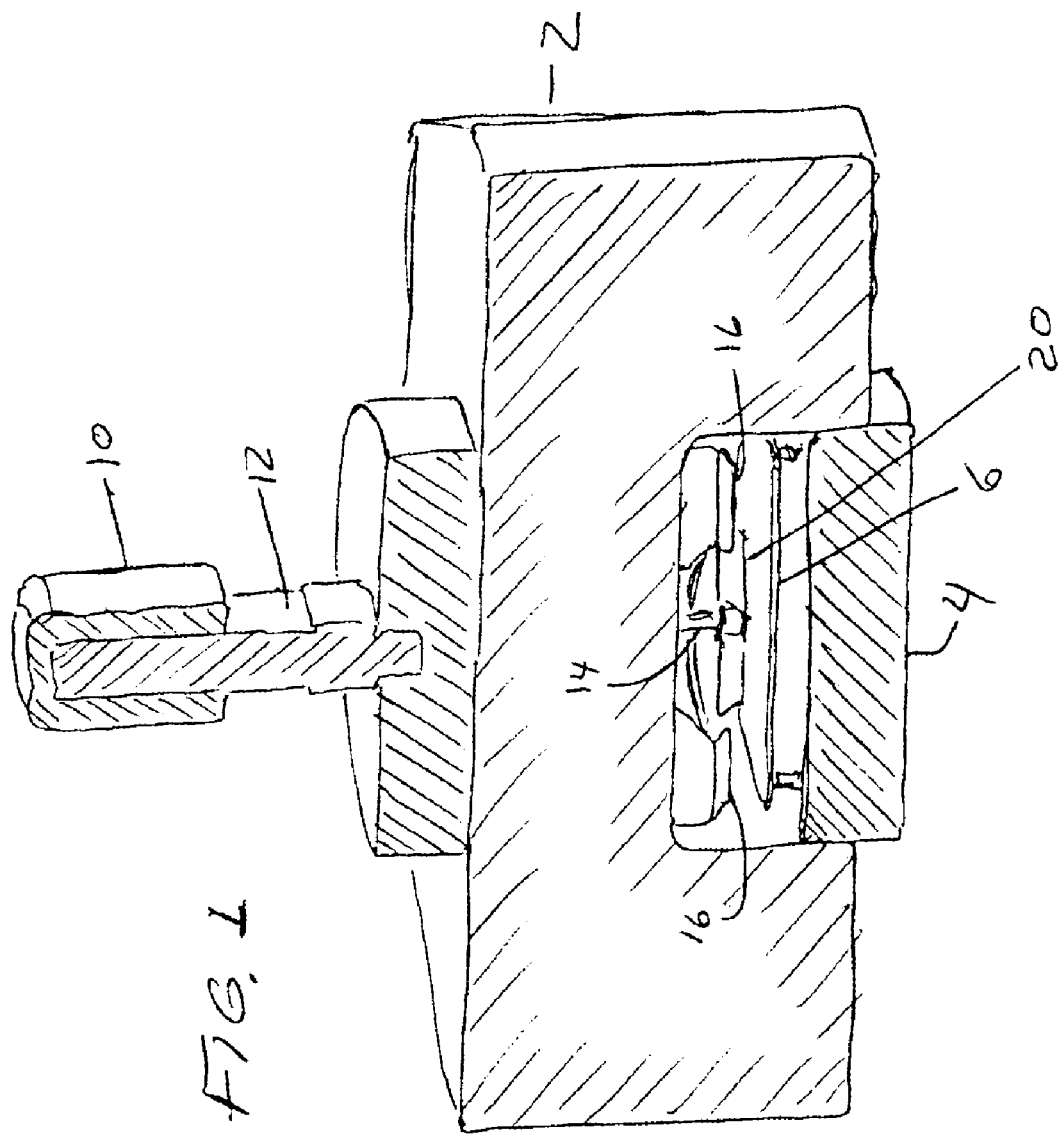
FIG. 1 is a perspective cross section view of a first embodiment of the invention, disclosing an external motor magnetically coupled to a shaft to which an impellor within the cleaning chamber which by rotation creates turbulence in the supercritical phase cleaning mixture in proximity to the substrate surface being cleaned.

The invention is susceptible of many embodiments. What is described here are merely preferred embodiments and best modes known to the Applicant, and are not in themselves limiting of the scope of the invention.

Referring now to the figures, to generate the desired additional mechanical force within the chamber, a high speed, magnetically coupled, agitation system is added to the process chamber. This agitator assembly delivers substantial kinetic energy to the fluid to induce the desired level of agitation, turbulence, and intra-chamber fluid flow, which is then applied through the fluid/substrate interface to the surface of the substrate. The agitation system consists of an externally mounted AC drive motor 10, connected to magnetic agitator coupler 12, and drive shaft 14, to which impeller 20 is attached; and baffles 16 which are affixed to the interior of the pressure vessel cleaning chamber in about the same plane and just outboard of the impeller. The impeller is positioned close to the surface of substrate 6, being cleaned.

FIG. 1 is an upper perspective cross section view of a first embodiment of the invention, sectioned to the near side of the centerline so that shaft 14 and cleaning fluid feedline 7 of FIG. 2 are contained within the chamber section. Underside lid 4 is equipped with substrate holding pins upon which is supported substrate 6.

FIG. 2 is a close up lower perspective cross section view of the embodiment of FIG. 1, sectioned so as to illustrate shaft 14, feedline 7, impellor 20, and fixed baffles 16 within the cleaning chamber. Lid 4 and substrate 6 of FIG. 1 are removed for clarity in this view.

High-speed impeller action in proximity to the baffles creates agitation, turbulence, and intra-chamber fluid flow that provides the additional mechanical force to the overall cleaning process and contributes in particular to completely removing the softened/loosened materials from the substrate surface and carrying it radially outward and away from the substrate. The loosened material is transported out of the chamber by continuous, periodic, or final through-flow of SCF during the cleaning process.

As explained above, the magnetic agitator coupler 12 is fitted into the top of the process chamber 2, and sealed using either a threaded, collar and gland, or flanged connection. Drive shaft 14 protrudes through the top and into the interior of the process chamber 2. Propeller/impeller 20 is affixed to the bottom of drive shaft 14. The type or style of the impellor may be of various configurations and diameter. The drive shaft is designed to be of a length that will suspend or position the impellor at the most desirable distance from the surface of the substrate.

A single impeller is preferred to be centered over the substrate, but an offset impeller or multiple impellers are within the scope of the invention. Furthermore, the impellers may be used in conjunction with rotation of the substrate. Also, the geometry of the chamber interior and the baffles may be configured to control the range of the turbulence and associated intra-chamber fluid flow induced by the energy imparted to the fluid by the impeller. For example, the baffles may be eliminated if the impellor, chamber geometry, and fluid dynamics are otherwise sufficient for producing the desired results.

The impeller and shaft can be rotated up to a maximum of about 2,500 RPM in preferred embodiments. The fluid flow dynamics and energy transmitted to the fluid and hence to the substrate will vary with the configuration of the overall chamber geometry, the impellor blades, any baffle assemblies present in the process chamber, proximity of the impeller to the substrate surface, and speed of impeller rotation. With a "pitched turbine" impeller, or "boat" style propeller, the mechanical force required for complete removal of organic films is mainly generated by a turbulent downward thrusting of the supercritical fluid mixture toward the substrate surface and then radially outward to lower pressure regions of the chamber, pushing and forcing the loosened material (film(s)) to be removed from the substrate in a center-to-edge clearing pattern. The mechanical energy that can be transmitted to the fluid can be in excess of five (5) horsepower, although lesser amounts may be adequate, causing any material that was loosened by the chemical interactions to break completely free of the substrate surface.

In preferred embodiments, the volume of flow of cleaning fluid through the chamber is calculated to match the speed with which material is being removed from the substrate, so as to prevent an over accumulation of loose debris in the fluid in the chamber. Different chamber configurations and processes conditions will dictate what is a sufficient volume and rate of fluid removal and makeup as compared to the total volume of fluid in the chamber.

Chamber configuration can help assure that loose debris migrates to areas where it will be readily absorbed and suspended in the outflow fluid stream and less likely to be returned to the high turbulence region and directed against the substrate from which it was removed. Inlet and chamber configuration can also provide for the inflow of make up fluid to be directed mainly into the impeller region, further assuring that the high energy fluid impacting the substrate surface is free of loose debris that might cause damage or lodge elsewhere on the surface.

In one preferred embodiment having a central supercritical fluid inlet proximate the impeller and a tangential chamber fluid outlet, the turbulent flow induced by the impeller action creates a radially outward expanding circular flow of supercritical fluid off the substrate such that loose debris tends to migrate by centrifugal force to the outflow stream of fluid. Other enhancements such as wafer rotation generated by internal or external means may be incorporated to add further energy to the fluid/substrate interface and promote a uniform cleaning action across the substrate surface.

The system may have other configurations, such as using multiple smaller impellers or holding or rotating multiple substrates within effective range of one or more impellers within a supercritical fluid environment; or having the planes of the substrates and impellors both oriented vertically rather than horizontally, or oriented orthogonally to each other such that the fluid force effect of the impeller is across the substrate surface rather than directed normally at the surface. In all cases, substantial mechanical energy from an independent source is added to the supercritical cleaning environment, affecting the fluid dynamics within the chamber, and contributing to the cleaning process at the fluid/substrate interface.

One example of the invention is a supercritical fluid cleaning station for cleaning selected substrates, where the cleaning station has a pressure chamber containing supercritical fluid, a substrate support within the chamber upon which at least one substrate may be placed for cleaning, and a supercritical fluid turbulent flow generator within the chamber. The turbulent flow generator has a power source external of the pressure chamber, and an agitation mechanism inside the pressure chamber proximate the substrate support for generating a turbulent flow within the supercritical fluid. By design of the chamber and the agitation mechanism, the turbulent flow is directed so as to impact the surface of a substrate on the substrate holder. A coupling mechanism connects the external power source to the internal agitation mechanism.

The agitation mechanism may incorporate a rotable impeller and drive shaft, or other type of movable vanes or paddles arranged for movement so that they can apply or impart turbulent flow to the supercritical fluid.

The external power source may be an electric motor such as a common A.C. motor mounted on the exterior of or near the pressure chamber. The coupling mechanism may be a magnetic coupler or other non-mechanical coupling mechanism that requires no mechanical linkage piercing the hull of the pressure chamber. The internal agitation mechanism may include at least one or a set or series of baffles arranged within the chamber near the impeller so as to cause or induce further turbulence and agitation in the supercritical fluid, or otherwise affect the turbulence flow and its direction as the impeller rotates.

There may be a supercritical fluid inlet configured to direct at least a portion of inflowing supercritical fluid towards the agitation mechanism so as to inject fresh fluid into the turbulent flow. There may be a supercritical fluid perimeter outlet, where the chamber and agitation mechanism are configured for intra-chamber fluid circulation so as to direct the turbulent flow off the surface of the substrate and into a circular perimeter path within the chamber. At least a portion of the volume of flow in the circular path may be continually discharged when the outlet is open for discharge and the inlet is open and admitting supercritical fluid into the chamber.

The invention is embodied in methods as well. For example, there is a method for cleaning material off the surface of a substrate that includes the following steps: Place a substrate in a pressure chamber in proximity to a supercritical fluid agitation mechanism; fill the pressure chamber with supercritical fluid; and generate an intra-chamber turbulent flow of supercritical fluid using an external power source, where the turbulent flow is directed at the surface of the substrate. An additional step may be to direct the turbulent flow radially off the surface of the substrate into a circular perimeter flow path within the chamber. A further step may be to flow supercritical fluid into the chamber through an inlet that terminates near or projects fluid towards the impeller; and to flow fluid out of the chamber through a perimeter outlet, where a portion of the supercritical fluid in the chamber in the circular perimeter flow path is being thereby removed, and the remaining portion of the supercritical fluid in the chamber being thereby replenished. In all cases, the supercritical fluid may be, or consist principally of, carbon dioxide, with or without suitable additives.

As yet another example of the invention, there is a supercritical fluid cleaning station with a pressure chamber containing supercritical fluid, a horizontally oriented substrate support upon which at least one substrate may be placed for cleaning within the chamber, and a supercritical fluid turbulent flow generator. The turbulent flow generator has a multi-bladed impeller located near the surface of a substrate positioned on the substrate holder. The impeller is mounted on the lower end of a vertically oriented rotable shaft within the chamber. There are a multiplicity of fluid baffles arranged around the periphery of the impeller. There is an external rotary power source coupled to the rotable shaft. The impeller is configured for generating turbulent fluid flow against the surface of the substrate when rotating. The chamber may be an inverted pressure vessel with an underside lid upon which the substrate holder is mounted.

The external rotary power source may be mechanically, magnetically, hydraulically or otherwise coupled to the rotable shaft. The impeller and rotable shaft may be fabricated of stainless steel. The impeller may be configured as a pitched turbine or boat style propeller, or other known fluid-moving configurations. The cleaning station may be manually operated or may be associated with an automated substrate loading and unloading system as might be found in a high volume production operation.

Other and various configurations, embodiments, variations and equivalents within the scope of the invention will be apparent to those skilled in the art from the abstract, description, figures and claims herein.

I claim:

1. A supercritical fluid cleaning station for cleaning substrates, said cleaning station having a pressure chamber containing supercritical fluid, a horizontally oriented substrate support upon which at least one substrate may be placed for cleaning within said chamber, and a supercritical fluid turbulent flow generator, said turbulent flow generator comprising:

a multi-bladed impeller located proximate to the surface of a substrate positioned on said substrate holder, said impeller being mounted on the lower end of a vertically oriented rotable shaft within the chamber, a multiplicity of fluid baffles arranged around the periphery of said impeller, and an external rotary power source coupled to said rotable shaft, said impeller configured for generating turbulent fluid flow against the surface of said substrate when rotating.

2. A supercritical fluid cleaning station for cleaning substrates according to claim 1, said external rotary power source being mechanically coupled to said rotable shaft.

3. A supercritical fluid cleaning station for cleaning substrates according to claim 1, said external rotary power source being magnetically coupled to said ratable shaft.

4. A supercritical fluid cleaning station for cleaning substrates according to claim 1, said impeller and said rotable shaft being fabricated of stainless steel.

5. A supercritical fluid cleaning station for cleaning substrates according to claim 1, said impeller comprising a pitched turbine impeller.

6. A supercritical fluid cleaning station for cleaning substrates according to claim 1, said impeller comprising a boat style impeller.

7. A supercritical fluid cleaning station for cleaning substrates according to claim 1, said supercritical fluid being carbon dioxide.

8. A supercritical fluid cleaning station for cleaning substrates according to claim 1, said cleaning station being associated with an automated substrate loading and unloading system.

* * * * *